(12) United States Patent
Zhao

(10) Patent No.: US 9,385,723 B1
(45) Date of Patent: Jul. 5, 2016

(54) CMOS LEVEL SHIFTER CIRCUIT WITH SELF-ADAPTIVE LOCAL SUPPLY BOOSTING FOR WIDE VOLTAGE RANGE OPERATION

(71) Applicant: Apple Inc., Cupertino, CA (US)

(72) Inventor: Bo Zhao, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/739,719

(22) Filed: Jun. 15, 2015

(51) Int. Cl.
*H03L 5/00* (2006.01)
*H03K 19/0185* (2006.01)
*H03K 3/356* (2006.01)
*H03K 19/003* (2006.01)
*H03K 17/10* (2006.01)

(52) U.S. Cl.
CPC .. *H03K 19/018521* (2013.01); *H03K 3/356113* (2013.01); *H03K 19/00315* (2013.01); *H03K 17/102* (2013.01)

(58) Field of Classification Search
CPC .............................................. H03K 19/018521
USPC .................. 327/306, 333; 326/80–82, 60–62
See application file for complete search history.

(56) References Cited

U.S. PATENT DOCUMENTS

| 7,456,654 | B1  | 11/2008 | Rau |
|---|---|---|---|
| 2005/0174158 | A1* | 8/2005 | Khan ............... H03K 3/356113 327/333 |
| 2014/0340119 | A1 | 11/2014 | Son et al. |
| 2015/0102795 | A1 | 4/2015 | Gao |

* cited by examiner

*Primary Examiner* — Dinh T Le
(74) *Attorney, Agent, or Firm* — Meyertons, Hood, Kivlin, Kowert & Goetzel, P.C.

(57) ABSTRACT

A level shifter that supports wide voltage range operation by adaptively boosting local supply voltage to its input stage. The level shifter may interface an input (low) voltage domain and an output (high) voltage domain. In the level shifter, an input stage may receive an input signal from the input voltage domain, and an output stage may generate an output signal to be sent to the output voltage domain. In the level shifter, the power supply to the low-voltage input stage is automatically and adaptively boosted to effectuate level conversion of the input signal. A boost control signal is generated when the output signal fails to switch or is slow to switch in response to a corresponding switching of the input signal. In this manner, the voltage operating range of the level shifter is increased. Because boosting is engaged only when needed, the level shifter provides efficient operation with self-adaptability.

16 Claims, 5 Drawing Sheets

CMOS LEVEL SHIFTER CIRCUIT WITH SELF-ADAPTIVE LOCAL SUPPLY BOOSTING FOR WIDE VOLTAGE RANGE OPERATION

BACKGROUND

1. Technical Field

The present disclosure generally relates to integrated circuit design, and in particular to level shifter circuits.

2. Description of Related Art

Modern integrated circuits, such as microprocessors or System-on-a-Chip (SoC) designs, are increasingly required to operate on low power levels such as, for example, in consumer electronic devices where conservation of battery power is very important. Although processor cores may be designed to operate at low power levels, the Input/Output (I/O) interfaces and memory modules may require higher power levels. In some cases, individual cores included in multi-core processors may operate at different supply voltage levels. Such "individualized" operational voltages give rise to multiple voltage "domains" or "islands" on a chip. In other words, modern multi-core architectures and SoC designs include multiple voltage domains on the chip—each voltage domain supplying a different voltage to the corresponding circuitry.

Because of different operating voltages, two circuits on a semiconductor chip or die may not be able to interface (or "talk") with each other unless a mechanism is employed to facilitate a smooth transition of signals from one circuit at one voltage level to the signals usable in the other circuit at another voltage level. A level shifter circuit is one such mechanism that connects one digital circuit operating at one voltage level to another digital circuit that works on another voltage level. Thus, when a signal must be transferred from one voltage domain to another voltage domain, a level shifter may be employed at the interface between these two voltage domains to convert the signal's voltage level. For example, an "up-conversion" level shifter may be needed when a signal passes from low voltage domain to a high voltage domain. On the other hand, a "down-conversion" level shifter may convert a signal from a high voltage domain (i.e., having a high voltage value) to a respective signal to be sent to a low voltage domain (i.e., having a low voltage value).

SUMMARY OF THE EMBODIMENTS

Various embodiments of level shift circuits are disclosed. Broadly speaking, a circuit is contemplated, in which a level shift circuit includes a first circuit stage, a second circuit stage, and a boost circuit. The first circuit stage may be configured to receive an input signal that transitions between a ground potential and first voltage level and generate a buffered signal dependent that transitions between the ground potential and a second voltage level. The second circuit stage may be configured to generate at least one output signal dependent upon the buffered signal. The at least one output signal may transition between the ground potential and a third voltage level that is greater than the first and second voltage levels. The boost circuit may be configured to change a voltage level of an intermediate power supply from the first voltage level to the second voltage level dependent upon a control signal.

In one embodiment, the level shift circuit further includes a control unit. The control unit may be coupled to the first circuit stage, the second circuit stage, and the boost circuit, and may be configured to generate the control signal dependent upon the buffered signal and the at least one output signal.

In a further embodiment, the control unit may be further configured to generate the control signal when the at least one output signal fails to transition in response to a corresponding transition of the input signal.

BRIEF DESCRIPTION OF THE DRAWINGS

In the following section, the inventive aspects of the present disclosure will be described with reference to exemplary embodiments illustrated in the figures, in which.

Figure 1:
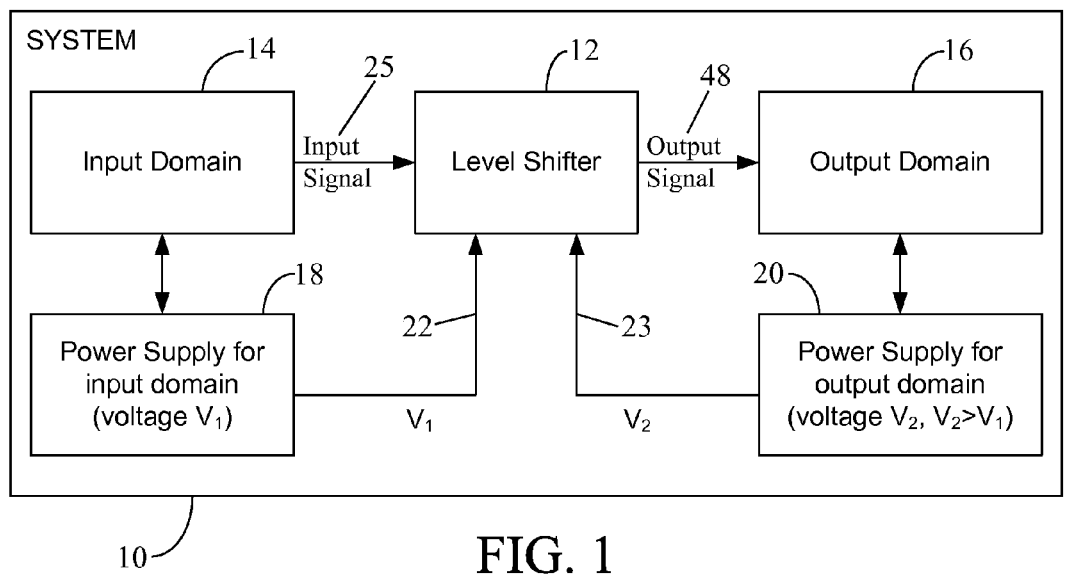
FIG. 1 illustrates a system in which a level shifter according to one embodiment of the present disclosure may be implemented.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

In the following detailed description, numerous specific details are set forth in order to provide a thorough understanding of the disclosure. However, it will be understood by those skilled in the art that the disclosed inventive aspects may be practiced without these specific details. In other instances, well-known methods, procedures, components and circuits have not been described in detail so as not to obscure the present disclosure. Additionally, the described inventive aspects can be implemented to perform voltage level shifting in any semiconductor-based system, including, for example, semiconductor memories, processors, memory controllers, interface units, and the like.

Depending on the context of discussion herein, a singular term may include its plural forms and a plural term may include its singular form. Similarly, a hyphenated term (e.g., "low-voltage," "up-conversion", "level-shifting," etc.) may be occasionally interchangeably used with its non-hyphenated version (e.g., "low voltage," "up conversion", "level shifting," etc.), and a capitalized entry (e.g., "Input Domain," "Level Shifter," "Booster Unit," etc.) may be interchangeably used with its non-capitalized version (e.g., "input domain," "level shifter," "booster unit," etc.). Such occasional interchangeable uses shall not be considered inconsistent with each other.

It is noted at the outset that the terms "coupled," "operatively coupled," "connected", "connecting," "electrically connected," and other terms of similar import, are used interchangeably herein to generally refer to the condition of being electrically/electronically connected in an operative manner. It is further noted that various figures (including component diagrams) shown and discussed herein are for illustrative purpose only, and are not drawn to scale.

It is also noted that the terms "first," "second," etc., as used herein, are used as labels for nouns that they precede, and do not imply any type of ordering (e.g., spatial, temporal, logical, etc.) unless explicitly defined as such. Furthermore, the term "power" is primarily used herein as referring to delivery of a "voltage." Thus, in the context of the signal level-shifting related discussion herein, the terms "power" and "voltage" may be considered to be interchangeably used.

FIG. 1 shows a system 10 in which a level shifter 12 according to one embodiment of the present disclosure may be implemented. For ease of illustration and discussion, only a portion of the system 10 is shown in FIG. 1; it is understood that the system 10 may include components in addition to those shown in FIG. 1. Furthermore, in the discussion herein, the level shifter 12 is assumed to be an up-conversion level shifter. As shown in FIG. 1, the level shifter 12 may interface or "link" two different voltage domains—an input or low voltage domain 14, and an output or high voltage domain 16. As mentioned earlier, the system 10 may include many more such voltage domains and corresponding level shifters. The simplified illustration in FIG. 1 is for ease of discussion only. The input domain 14 may include logic circuits operating at a first voltage level "$V_1$," whereas the output domain 16 may include logic circuits operating at a second voltage level "$V_2$", which is higher than $V_1$ ($V_2 > V_1$). In one embodiment, such logic circuits may include different processor cores or different portions of a single processor core operating at different supply voltages. The logic circuits or logic blocks in the input domain 14 may receive their supply voltage $V_1$ from an input power supply 18, whereas an output power supply 20 may provide supply voltage $V_2$ to the logic blocks in the output domain 16. In one embodiment, the power supply units 18, 20 may be Voltage Regulator Modules (VRMs) providing regulated power to respective logic circuits. In one embodiment, there may be a single VRM (not shown) in the system 10 that is configured to generate a number of different voltage levels so as to provide different supply powers to the input and output domains 14, 16, respectively. In another embodiment, the power supply units 18, 20 may be part of a system-wide power supply unit (not shown) in the system 10.

Figure 3:
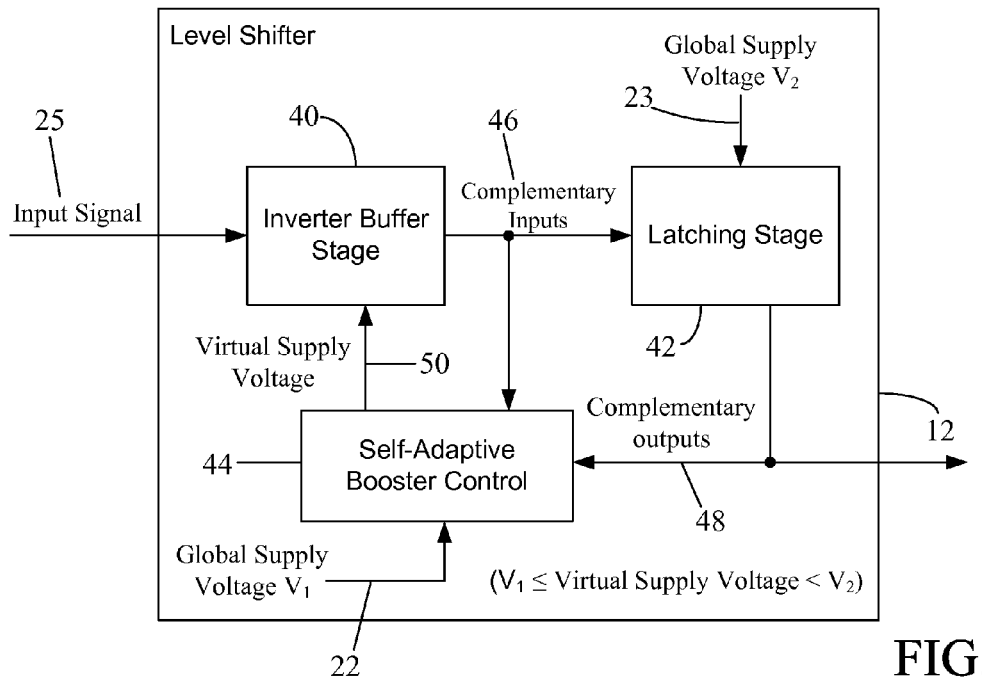
FIG. 3 depicts an embodiment of the level shifter as illustrated in FIG. 1.
Figure 4:
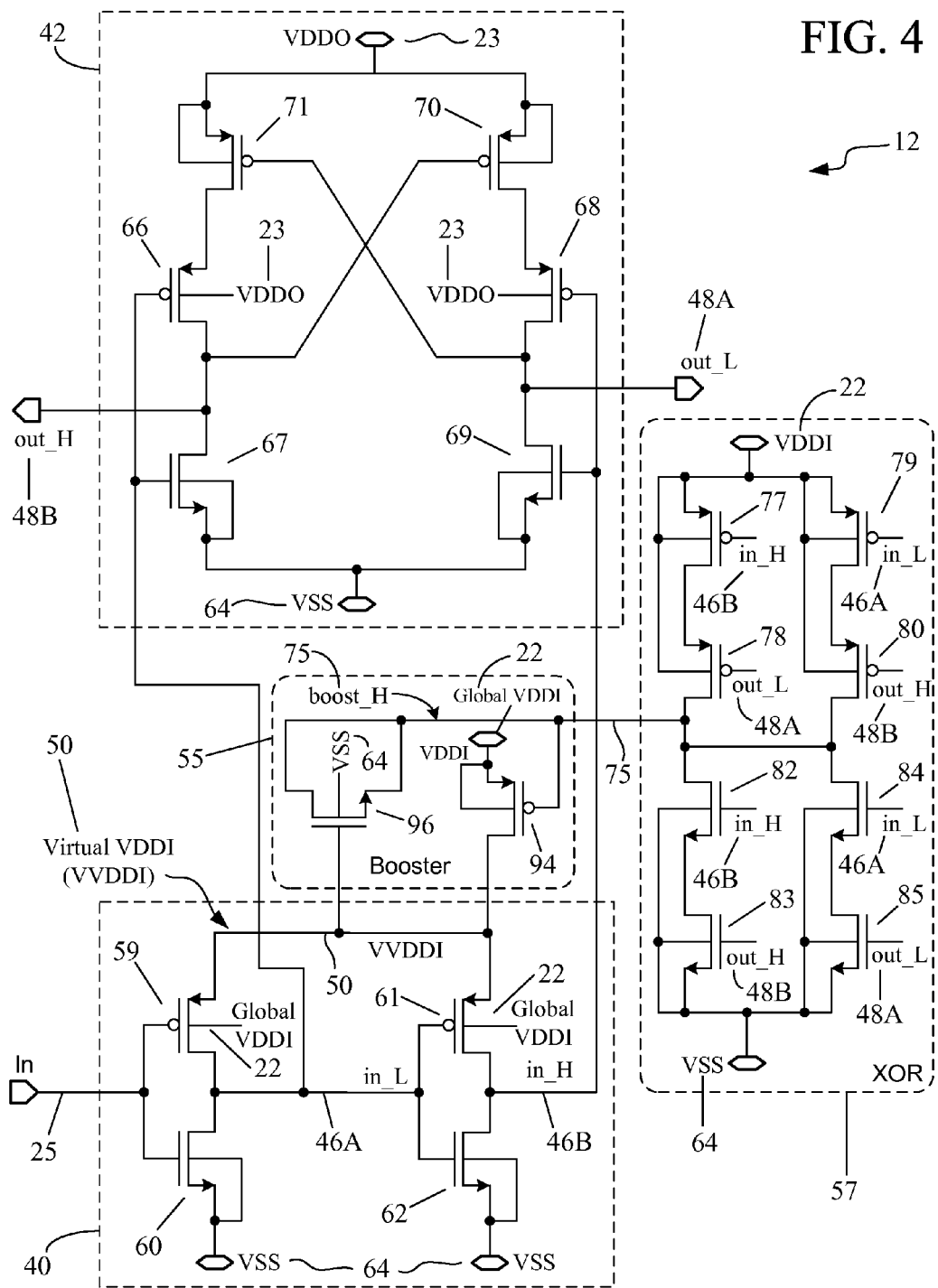
FIG. 4 provides a detailed circuit schematic of the level shifter in FIG. 3 according to one embodiment of the present disclosure.

As shown by arrows 22-23 in the embodiment of FIG. 1, the level shifter 12 may receive the voltage levels "$V_1$" and "$V_2$" as supply voltages. In that regard, the level shifter 12 may be considered a "dual supply" level shifter. The level shifter 12 may also receive an input signal 25 from the input domain 14 and generate corresponding output signals 48 to be sent to the output domain 16. Although output signals 48 are depicted as a single wire, in various embodiments, any suitable number of output signals may be employed. In some embodiments, output signals 48 may include at least two signals that are logical complements of each other. In one embodiment, the input signal 25 and the complementary output signals 48 may be binary digital signals having two operational states—a low (or ground) state and a high state. Thus, the input signal 25 may transition between a ground potential and the first voltage level $V_1$, whereas the complementary output signals 48 may transition between the ground potential and the second voltage level $V_2$. In this manner, voltage conversion of the input signal may be facilitated by the level shifter 12. Additional architectural details of the level shifter 12 are shown in FIGS. 3-4, which are discussed later below to further describe the operation of the level shifter 12 as per teachings of the present disclosure.

The system 10 may be, for example, a computer system (desktop or laptop), a tablet computer, a mobile device, a cellular phone or other User Equipment (UE), a video gaming unit or console, a machine-to-machine (M2M) communication unit, a stateless "thin" client system, or any other type of computing or data processing device. In other embodiments, the system 10 may be a processor such as, for example, a Central Processing Unit (CPU), a microprocessor, an Arithmetic Logic Unit (ALU), a Graphics Processing Unit (GPU), a memory controller, a peripheral interface controller such as a Peripheral Component Interconnect Express (PCIe) root complex or switch, or any other processing device. In particular embodiments, the processor may include more than one CPUs, and/or the system 10 may include more than one processors (e.g., in a distributed processing configuration). The processor may be a System on Chip (SoC), a server processor, or an Application Processor (AP) having functionality in addition to a CPU functionality. In particular embodiments, instead of or in addition to the CPU, the processor may contain any other type of processors such as, for example, a general purpose processor, a special purpose processor, a conventional processor, a microcontroller, a Digital Signal Processor (DSP), a plurality of microprocessors, one or more microprocessors in association with a DSP core, a dedicated Application Specific Integrated Circuit (ASIC) processor, Field Programmable Gate Array (FPGA) circuits, a state machine, and the like.

In other embodiments, the system 10 may be a memory unit, which may be any semiconductor-based storage system such as, for example, Dynamic Random Access Memory (DRAM), Static Random Access Memory (SRAM), Three Dimensional Stack (3DS) memory module, Double Data Rate (DDR) memory, DDR 2, 3, or 4 (DDR2/DDR3/DDR4) memory, Synchronous DRAM (SDRAM), Rambus®

DRAM, flash memory, various types of Read Only Memory (ROM), etc. In still further embodiments, the system 10 may be a peripheral storage unit, which is configured to provide support for magnetic, optical, magneto-optical, or solid-state storage media such as hard drives, Solid State Drives (SSDs), optical disks (such as CDs or DVDs), non-volatile RAM devices, and the like.

Figure 2:
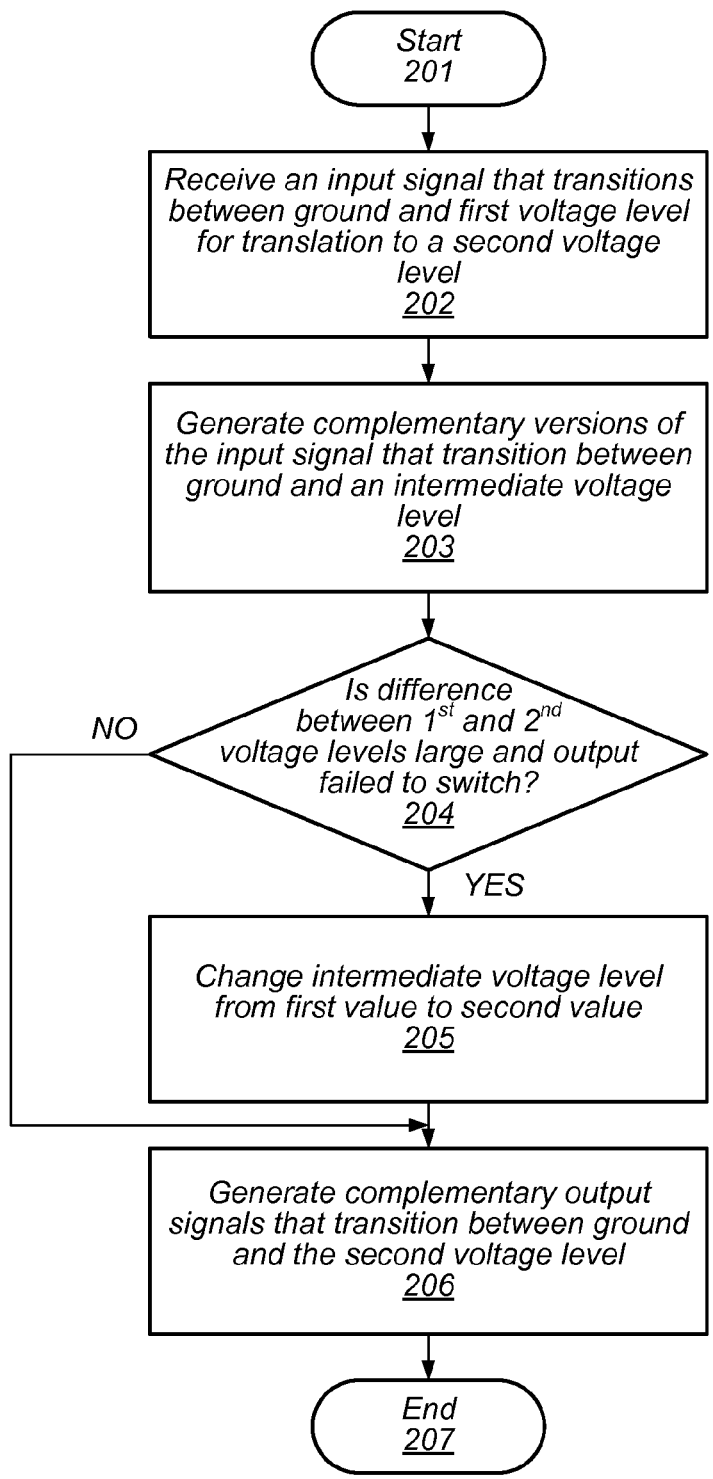
FIG. 2 illustrates a flowchart depicting an embodiment of a method of adaptive-boosting based voltage level shifting according to one embodiment of the present disclosure.

FIG. 2 illustrates a flow diagram depicting an embodiment of a method of adaptive-boosting based voltage level shifting according to one embodiment of the present disclosure. Referring collectively to level shifter 12 of FIG. 1, the method begins in block 201. An input signal that transitions between a ground potential and a first voltage level (such as, for example, the voltage level "$V_1$" in FIG. 1) may then be received for translation to a second voltage level (bock 202). Complementary signals may then be generated using the received input signal (block 203). In some embodiments, the complementary signals may transition between the ground potential and an intermediate voltage level. Although the generation of complementary versions of the input signal is described, in other embodiments, a single buffered version of the input signal, or logical negation of the input signal may be employed.

The method may then depend on a difference between the first and second voltage levels and if the output level shifter 12 has failed to switch (block 204). If the voltage level between the first and second voltage levels is large, i.e., the difference exceeds a predetermined threshold value, and the output of level shifter 12 has failed to transition, then a level of the intermediate voltage level is increased to a new value (block 205). In some embodiments, the new value may be substantially the same of the second voltage level. It is noted, however, that any suitable voltage level may be employed. Complementary output signals may then be generated by level shifter 12 using the complementary input signals (block 206). In some embodiments, the complementary output signals may transition between the ground potential and the second voltage level. With the generation of the complementary output signals, the method may conclude in block 207.

Alternatively, if the difference between the first and second voltage levels is not large or the output of level shifter 12 switches, the method may proceed from block 206 as described above. Although the operations described in regard to the method illustrated in FIG. 2 are depicted as being performed sequentially, in other embodiments, one or more of the operations may be performed in parallel.

Turning to FIG. 3, an embodiment of level shifter 12 is illustrated. As shown, the level shifter 12 receives the input signal 25 (from the input voltage domain 14) and generates a voltage-shifted version of the input signal—i.e., the output signals 48—to comply with the operating voltage requirements of the output voltage domain 16. Structurally, in one embodiment, the level shifter 12 may include an inverter buffer stage 40, a latching stage 42, and a self-adaptive booster control unit 44 in the operative relationship illustrated in FIG. 3.

The inverter stage 40 may be considered a low voltage "input stage" of the level shifter, whereas the latching stage 42 may operate as a high voltage "output stage"—both of which collectively accomplish the voltage level shifting of the input signal 25 from the low input voltage (of the input domain 14) to the high output voltage (of the output domain 16). The output stage 42 of the level shifter 12 may receive the fixed, global supply voltage $V_2$—which is the same supply voltage used for the logic circuits in the output domain 16—as its own supply voltage, as shown by arrow 23 in FIGS. 1 and 3. However, the input stage 40 of the level shifter 12 may not directly receive the supply voltage $V_1$ of the input domain 14. Rather, in one embodiment, the control unit 44 may directly receive the supply voltage $V_1$ as shown by arrow 22 in FIGS. 1 and 3, and may generate a virtual (variable) supply voltage 50 to be provided to the input/buffer stage 40, as discussed below. In particular embodiments, the input voltage $V_1$ is less than or equal to the virtual supply voltage 50, and the virtual supply voltage 50 itself is less than the output voltage $V_2$—i.e., $V_1 <$ virtual supply voltage $< V_2$.

The control unit 44 may operate in a feedback manner to "regulate" the supply voltage 50 to the buffer stage 40. Because of its feedback configuration, the control unit 44 may be able to adaptively boost the supply voltage 50 to the input stage 40, whenever necessary, so as to extend the voltage operating range of the level shifter 12. For example, as illustrated in FIG. 3, the control unit 44 may receive complementary signals 46 from the buffer stage 40 and output signals 48 from the latching stage 42 as its inputs. Based on the logic levels of these complementary signals 46 and output signals 48, the control unit 44 may generate the appropriate supply voltage 50 for the input buffer stage 40 of the level shifter 12. In the discussion herein, the output signals 46 from the buffer stage 40 may be referred to as "complementary inputs," whereas the output signals 48 from the latching stage 42 may be referred to as "complementary outputs." Additional operational details of the level shifter 12 in FIG. 3 and various signals associated with its operation are provided below with reference to discussion of FIGS. 4-6.

The supply voltage 50 may be referred to as a "virtual" supply voltage because it is not fixed like the global supply voltages $V_1$ and $V_2$. Rather, as shown in FIG. 3, the global supply voltage $V_1$ may be directly applied to the control unit 44, which may then generate the appropriate voltage level for the supply voltage 50. For example, if there is no need to boost the input voltage $V_1$, the control unit 44 may provide a voltage level for the supply voltage 50 that is substantially the same as voltage $V_1$. On the other hand, if the output signal 48 fails to switch or is slow to switch in response to switching of the input signal 25, the control unit 44 may provide a "boost" to its supply voltage $V_1$, and generate a boosted level of the supply voltage $V_1$ to be provided as the virtual supply 50 to the buffer stage 40, so as to enable smooth transitioning from the input signal 25 to the output signals 48. In this manner, operational voltage range of the level shifter 12 may be extended.

FIG. 4 provides a detailed circuit schematic of the level shifter 12 in FIG. 3 according to one embodiment of the present disclosure. For ease of discussion, the same reference numerals are used in FIGS. 1, 3, and 4 to refer to the same (or substantially similar) components, functional blocks, or signals. Furthermore, although voltages and signals are indicated by arrows in FIGS. 1 and 3, it is noted that the reference numerals associated with those arrows are also used in FIG. 4 to refer to the corresponding signal or voltage for ease of discussion. For example, the reference numeral "22" is used in FIG. 4 to refer to the supply voltage VDDI (of the input domain 14) as an example of the voltage $V_1$ in FIGS. 1 and 3, the reference numeral "23" is used to refer to the supply voltage VDDO (of the output domain 16) as an example of the voltage $V_2$ in FIGS. 1 and 3, the reference numeral "50" is used in FIG. 4 to refer to Virtual VDDI (VVDDI) voltage as an example of the virtual supply voltage at arrow 50 in FIG. 3, and so on.

The inverter buffer stage 40 and the latching stage 42 shown in FIG. 3 are identified by blocks with dashed lines in FIG. 4. On the other hand, the control unit 44 in FIG. 3 is identified by its constituent component blocks—a booster circuit 55 and a control signal generator 57—in FIG. 4. In other words, the booster circuit 55 and the control signal generator 57 collectively represent the control unit 44, and provide the functionality attributed to the control unit 44 in the discussion herein. In the embodiment of FIG. 4, the control signal generator 57 is an exclusive-OR (XOR) gate, which is discussed in more detail later below.

In one embodiment, the input stage 40 in FIG. 4 may include two pairs of Complementary Metal-Oxide Semiconductor (CMOS) transistors in source-follower configuration—the first pair includes a P-channel Metal-Oxide Semiconductor (PMOS) transistor 59 and an N-channel Metal-Oxide Semiconductor (NMOS) transistor 60, whereas the second pair includes the PMOS transistor 61 and the NMOS transistor 62. Each source follower pair 59-60 and 61-62 may be connected to receive the virtual (variable) supply voltage 50—referred to as Virtual VDDI (VVDDI) voltage in FIG. 4—from the booster circuit 55 as shown. In various embodiments, the bulk connections of PMOS transistors 59 and 61 may be connected to the voltage level VDDI. The generation and variable voltage levels of this VVDDI signal are discussed later below. The NMOS transistors 60, 62 in these source follower pairs may be connected to a ground potential—identified as the "VSS" voltage 64 in FIG. 4. In one embodiment, the ground potential may be common to all circuit components in the system 10. As mentioned earlier, the voltage level "VDDI" in FIG. 4 represents the supply voltage $V_1$ of the input domain 14 (FIG. 1), and the voltage level "VDDO" represents the supply voltage $V_2$ of the output domain 16 (FIG. 1). Thus, in one embodiment, the input signal 25 in FIG. 4 may be considered to transition between VDDI and VSS voltage levels. On the other hand, the output signal 48—which is represented by two complementary outputs 48A-48B in FIG. 4—may be considered to transition between VDDO and VSS voltage levels.

Assuming an active-high input signal 25, the inverter buffer stage 40 may generate a pair of complementary buffered signals—an in_L signal 46A and an in_H signal 46B. These complementary buffered signals 46A-46B collectively comprise the buffered signals 46 in FIG. 3. The first transistor pair 59-60 in the buffer stage 40 may generate the in_L signal 46A representing a steady-state low-transition state of the input signal 25, whereas the second transistor pair 61-62 in the buffer stage 40 may generate the in_H signal 46B representing a steady-state high-transition state of the input signal 25. As shown in the exemplary waveforms in FIG. 5B (which is discussed later), at least the in_H signal 46B may transition between the ground potential VSS 64 and the virtual supply voltage VVDDI 50. The buffered signals 46A-46B may be received by the latching stage 42 as shown in FIG. 4. The latching stage 42 may also include two CMOS transistor pairs 66-67 and 68-69 in the source-follower configuration. The PMOS transistors 66, 68 in the CMOS pairs 66-67 and 68-69 may be cross-coupled with PMOS transistors 70 and 71, respectively, as shown. The PMOS transistors 70-71 may be referred to as "pull-up" PMOS stack in view of their utilization in "pulling up" or "shifting" the input voltage level from VDDI to VDDO. These NMOS transistors 67 and 69 may be referred to as "pull-down" NMOS transistors. The latching stage 42 may operate at the higher supply voltage VDDO 23 as shown by connection of PMOS transistors 70-71 to this voltage level. On the other hand, the NMOS transistors 67 and 69 in the latching stage 42 may be connected to the ground potential VSS 64, as shown.

The latching stage 42 may generate two complementary output signals—an out_L signal 48A representing a steady-state low-transition state of the output signals 48 (FIG. 3), and an out_H signal 48B representing a steady-state high-transition state of the output signals 48. As shown in the exemplary waveforms in FIG. 5B (which is discussed later), each of these complementary output signals 48A-48B may transition between the ground potential VSS 64 and the supply voltage VDDO 23 of the output domain 16 (FIG. 1), thereby effectively shifting the voltage level of the input signal from VDDI to VDDO.

As mentioned earlier, the booster circuit 55 and the control signal generator 57 in FIG. 4 constitute the booster control unit 44 shown in FIG. 3. The adaptive control of the virtual VDDI 50 through the combination of these two units 55, 57 is discussed now with reference to FIGS. 5A-5B.

Figure 5A:
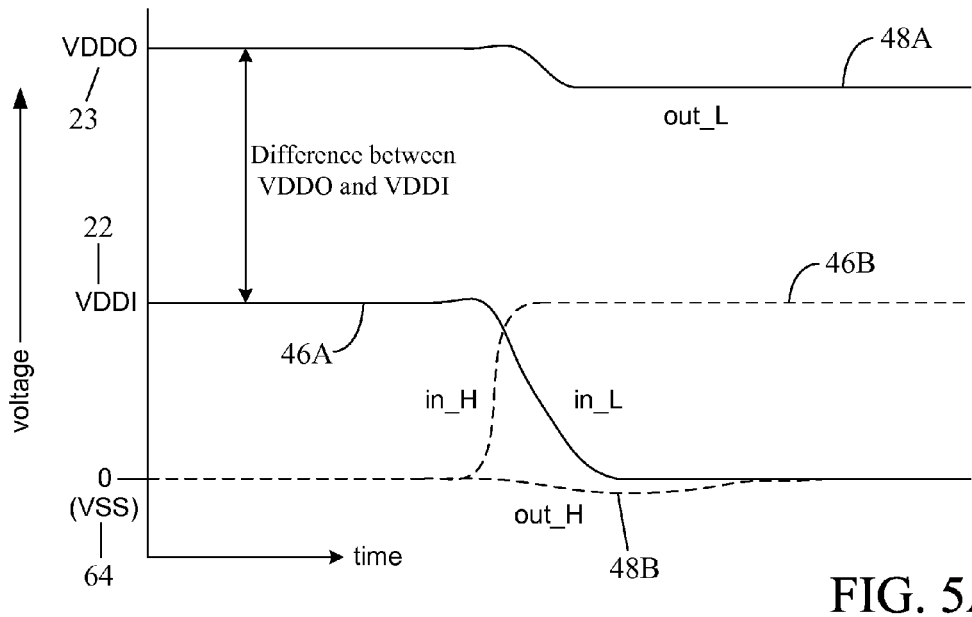
FIG. 5A is an illustration of the operation of the level shifter in FIG. 3 in the absence of the self-adaptive control unit according to one embodiment of the present disclosure.
Figure 5B:
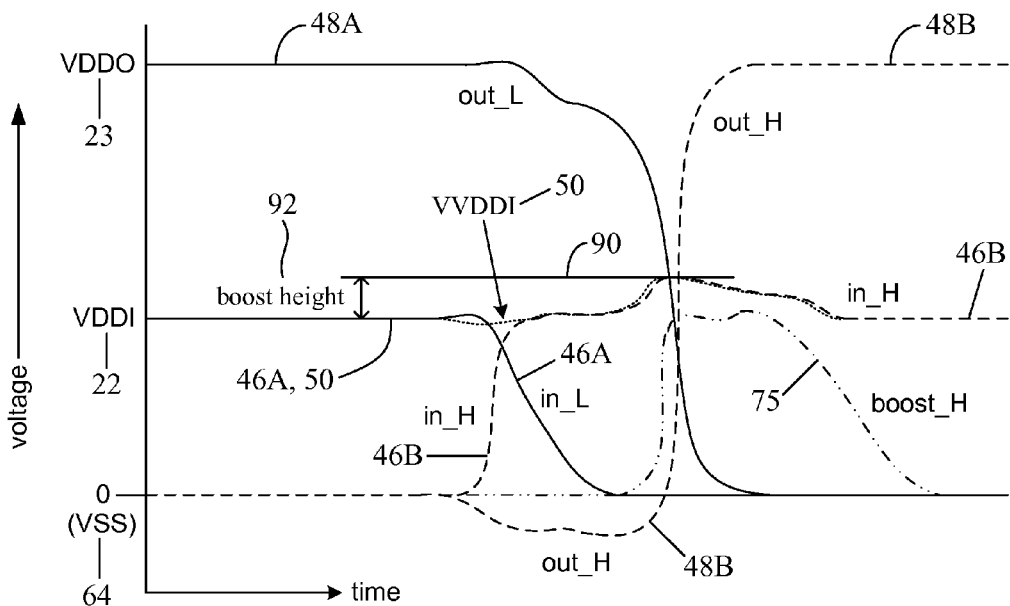
FIG. 5B is an illustration of the operation of the level shifter in FIG. 3 in the presence of the self-adaptive control unit according to one embodiment of the present disclosure.

FIG. 5A is an illustration of the operation of the level shifter 12 in FIG. 3 in the absence of the self-adaptive control unit 44 according to one embodiment of the present disclosure. As shown in FIG. 5A, under certain operating conditions, when the difference between VDDO 23 and VDDI 22—i.e., the difference between the operating voltages of the output and input voltage domains 16, 14, respectively—is large, the output signals 48A-48B may fail to switch in response to and dependent upon corresponding transitioning of the input signals 46A-46B, respectively. In FIGS. 5A-5B, the in_L signal and its corresponding out_L signal are shown by straight (non-dashed) lines, whereas the in_H signal and its corresponding out_H signal are shown by a dashed line having the pattern "- - - -." To accomplish the triggering of the output in the event of a large difference between VDDO and VDDI, it may be desirable to provide an overdrive voltage for the pull-down NMOS transistors 67 and 69. In one embodiment, the virtual supply voltage VVDDI 50 may boost the level of the input domain's supply voltage VDDI 22 to increase a voltage level of signals 46A and 46B through PMOS transistors 59 and 61, and therefore increasing (or overdriving) the gate-to-source voltage (Vgs) of each of the pull-down transistors 67 and 69.

FIG. 5B is an illustration of the operation of the level shifter 12 in FIG. 3 in the presence of the self-adaptive control unit 44 according to one embodiment of the present disclosure. As noted before, in the embodiment of FIG. 4, the booster circuit 55 and the control signal generator 57 constitute the booster control unit 44 of FIG. 3. In one embodiment, the control signal generator 57 may generate a control signal (which is referred to herein as the "boost_H signal") 75 adaptively. For example, this control signal 75 may be generated only when at least one of the output signals 48A-48B fails to transition in response to and dependent upon a transitioning of its corresponding input signal 46A or 46B. As discussed later below, the control signal 75 may "trigger" the booster circuit 55 to boost the input stage's 40 supply voltage to provide the earlier-mentioned overdrive voltage. In one embodiment, the boost_H signal 75 may be an active-high signal, which is illustrated in FIG. 5B using a dashed line having the pattern "- • • - • • - • • -". Thus, to detect such input-to-output transitioning failure(s) and to responsively (and adaptively) generate the boost_H signal 75, in one embodiment, the control signal generator 57 may be an XOR gate that receives all complementary inputs 46 and complementary outputs 48 as its inputs and generates the boost_H signal 75 that effectively represents the result of an XOR operation between the input signal 25 and the output signals 48 (FIGS. 1 and 3). The detailed circuit schematic of the XOR gate based control signal generator 57 is shown in FIG. 4, where the signal generator 57 is shown to include two pairs of PMOS transistors 77-78 and 79-80, and two pairs of NMOS transistors 82-83 and 84-85 with respective signal inputs. As shown, in one embodiment, the transistors in the control signal generator 57 may operate over (or biased between) the voltage range of VDDI 22 and VSS 64.

In one embodiment, instead of an XOR gate, the control signal generator 57 may be implemented as a pulse generator in a non-adaptive manner, in the sense that the pulse generator may provide the boost_H signal 75 as a pulse every time at least one of the buffered signals 46A, 46B transitions from one state to another. In this manner, the higher voltage level for VVDDI 50 may be generated every time, regardless of whether there is any difficulty or failure in switching the output signals 48.

It is noted here that, in the absence of the control signal 75, the booster circuit 55 may simply provide the voltage level of the VDDI voltage 22 as the virtual supply voltage VVDDI 50 to the input (buffer) stage 40. In other words, VVDDI=VDDI when there is no control signal 75 from the control signal generator 57. However, upon receiving the boost_H signal 75, the booster circuit 55 may increase the VDDI voltage level to generate a boosted version of the VDDI voltage level as the virtual supply voltage VVDDI signal 50 for the input stage 40. Such transitioning of the VVDDI signal 50 from the VDDI level to a higher (VDDI+) level 90 is shown in FIG. 5B using a plot with a dashed line having the pattern "••••••••". In one embodiment, the booster circuit 55 may boost the VDDI voltage by a pre-determined amount to "elevate" the VVDDI voltage level to the level 90. Such pre-determined amount is identified as "boost height" 92 in FIG. 5B.

As shown in FIG. 4, the booster circuit 55 may include a PMOS header switch 94 and an NMOS capacitor 96 connected in parallel to the PMOS header 94. The PMOS header switch 94 may receive VDDI 22 at its source terminal as the bias voltage for the PMOS header, and may receive the boost_H signal 75 from the control signal generator 57 at its gate terminal. The NMOS capacitor 96 may provide the necessary voltage boost in response to the boost_H signal 75, while the PMOS header 94 may maintain an isolation between the global VDDI voltage 22 and the boosted VVDDI voltage 50 being supplied to the input stage 40. On the other hand, when the boost_H signal 75 is absent (i.e., the boost_H signal line 75 is at low level), the PMOS header switch 94 may conduct to apply the VDDI voltage level as the VVDDI supply voltage 50 to the input stage 40.

It is noted that the boost_H signal 75 may be triggered only when the output switching is slow or difficult—such as that shown, for example, in FIG. 5A. Thus, as shown in FIG. 5B, for example, when the in_H signal 46B transitions towards VDDI, the out_H signal 48B fails to make a corresponding transition to VDDO. As a result, the boost_H signal 75 may be triggered to boost the voltage level of in_H signal 46B to the VDDI+ level 90, which, in turn, may result in triggering a transition of the out_H signal 48B to the VDDO level. Boosting the in_H signal 46B may also effectively pull down the out_L signal 48A if it fails or is slow to transition to the VSS level in response to a corresponding transition of the in_L signal 46A.

Figure 6:
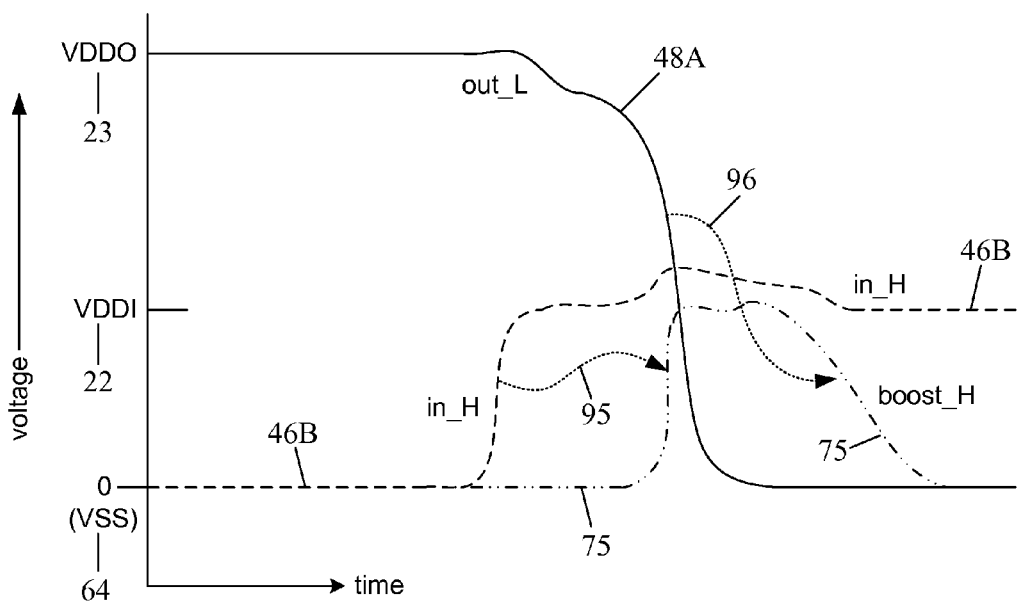
FIG. 6 is an illustration of how the width of a boost pulse may be determined according to one embodiment of the present disclosure.

FIG. 6 is an illustration of how the width of a boost pulse—such as the boost_H signal 75 in FIG. 5B—may be determined according to one embodiment of the present disclosure. Only the relevant waveforms from FIG. 5B are reproduced in FIG. 6 to illustrate when boosting may be activated and deactivated according to particular embodiments of the present disclosure. Because the level shifter 12 is an up-conversion level shifter, in one embodiment, when the output switching is slow or difficult, the boosting may be activated when the input signal switches high. Thus, in one embodiment, boosting may be triggered in response to the rising edge of the in_H signal 46B as indicated by dotted arrow 95. After an inherent processing delay, a pulse for the boost_H signal 75 may be generated by the control signal generator 57 (FIG. 4). In one embodiment, the boost pulse 75 may be de-asserted when the out_L signal 48A successfully switches to the "low" (VSS) level, as indicated by dotted arrow 96. In this manner, the width of the boost pulse 75 may track the delay between the transitioning of the in_H signal 46B and the out_L signal 48A. Alternatively, although not shown in FIG. 6, the width of the boost pulse 75 may depend on the delay between the transitioning of the in_L signal 46A and the out_H signal 48B.

Thus, when output switching is fast enough, the boost pulse 75 may disappear and boosting may not occur at all, thereby saving energy. Similarly, the boost pulse width may decrease if VDDI is increased or the difference between VDDO and VDDI is decreased. In one embodiment, the voltage operating range of the level shifter 12 in FIG. 4 may be extended further by increasing the size of the boost capacitor 96. The voltage operating range may be given by the difference between the highest level of the output signals 48 and the highest level of the input signal 25. Thus, for the extended voltage operating range, the highest level of the input signal 25 may be less than VDDI, but the level shifter 12 still may be able to perform the level shifting to the VDDO level due to the increased size of the boost capacitor 96.

In the preceding description, for purposes of explanation and not limitation, specific details are set forth (such as particular architectures, circuit diagrams, techniques, etc.) in order to provide a thorough understanding of the disclosed technology. However, it will be apparent to those skilled in the art that the disclosed technology may be practiced in other embodiments that depart from these specific details. That is, those skilled in the art will be able to devise various arrangements which, although not explicitly described or shown herein, embody the principles of the disclosed technology. In some instances, detailed descriptions of well-known devices, interchangeability of devices, circuits, and methods are omitted so as not to obscure the description of the disclosed technology with unnecessary detail. All statements herein reciting principles, aspects, and embodiments of the disclosed technology, as well as specific examples thereof, are intended to encompass both structural and functional equivalents thereof. Additionally, it is intended that such equivalents include both currently known equivalents as well as equivalents developed in the future, e.g., any elements developed that perform the same function, regardless of structure.

Thus, for example, it will be appreciated by those skilled in the art that block diagrams herein, such as, for example, in FIGS. 1 and 3 can represent conceptual views of illustrative circuitry or other functional units embodying the principles of the technology. Similarly, it will be appreciated that the flow chart in FIG. 2 herein may represent various processes or innovative aspects which may be substantially performed by a suitably-configured level shifter such as, for example, the level shifter 12 in FIGS. 1, 3, and 4. Furthermore, the CMOS-based exemplary embodiment of the level shifter 12 in FIG. 4 may be implemented using any other semiconductor devices having similar functionality. Also, the herein-described approach of adaptive generation of supply voltage to an input stage of a level shifter may be suitably modified to be used in case of a down-conversion level shifter. In that case, a voltage reduction pulse may be generated instead of a boost pulse.

Alternative embodiments of the self-adaptive level shifting methodology according to inventive aspects of the present disclosure may include additional components responsible for providing additional functionality, including any of the functionality identified above and/or any functionality necessary to support the solution as per the teachings of the present disclosure. Although features and elements are described above in particular combinations, each feature or element can be used alone without the other features and elements or in various combinations with or without other features.

The foregoing describes a level shifter circuit that supports wide voltage range operation by adaptively boosting local supply voltage to its input stage. The level shifter may interface an input (low) voltage domain and an output (high) voltage domain. The input stage of the level shifter may receive an input signal from the input voltage domain, and the output stage of the level shifter may generate an output signal to be sent to the output voltage domain. In the level shifter, the power supply to the low-voltage input stage is automatically and adaptively boosted, whenever needed, to effectuate level conversion of the input signal received at the input stage. In the level shifter, a boost control signal is generated when the output signal fails to switch or is slow to switch in response to a corresponding switching of the input signal. In this manner, the voltage operating range of the level shifter unit is increased. Because boosting is engaged only when needed, the level shifter provides efficient operation with self-adaptability.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    a first circuit stage coupled to a power supply, wherein the first circuit stage is configured to:
        receive an input signal, wherein the input signal transitions between a ground potential and a first voltage level, and
        generate at least one buffered signal dependent upon the input signal, wherein the at least one buffered signal transitions between the ground potential and a second voltage level;
    a second circuit stage configured to generate at least one output signal dependent upon the at least one buffered signal, wherein the at least one output signal transitions between the ground potential and a third voltage level, and wherein the third voltage level is greater than the first voltage level and the second voltage level;
    a control unit coupled to the first circuit stage, the second circuit stage, and the boost circuit, wherein the control unit is configured to generate a control signal dependent upon the at least one buffered signal and the at least one output signal, and wherein the control unit is further configured to supply the control signal to the boost circuit; and
    a boost circuit coupled to the power supply, wherein the boost circuit is configured to change a voltage level of the power supply from the first voltage level to the second voltage level dependent upon the control signal.

2. The apparatus of claim 1, wherein the control unit is configured to generate the control signal only when the at least one output signal fails to transition in response to and dependent upon a corresponding transitioning of the input signal.

3. The apparatus of claim 1, wherein the control unit includes an exclusive-OR (XOR) gate.

4. The apparatus of claim 1, wherein the at least one buffered signal includes:
    a ground potential state of the input signal; and
    a second voltage level of the input signal;
and wherein the at least one output signal includes:
    the ground potential state of the output signal; and
    a third voltage level of the output signal.

5. The apparatus of claim 1, wherein the boost circuit is further configured to increase the first voltage level by a pre-determined amount to generate the second voltage level.

6. The apparatus of claim 1, wherein the second circuit stage includes a pair of transistors, and wherein the second voltage level is a minimum overdrive voltage for the pair of transistors to trigger transitioning of the at least one output signal by the second circuit stage in response to and dependent upon a corresponding transitioning of the input signal.

7. The apparatus of claim 1, wherein the second voltage level substantially equals the first voltage level when the control signal is not asserted.

8. The apparatus of claim 1, wherein each of the first and the second circuit stages includes a respective plurality of Complementary Metal-Oxide Semiconductor (CMOS) transistors.

9. The apparatus of claim 1, wherein boost circuit includes the following:
    a P-channel Metal-Oxide Semiconductor (PMOS) transistor that is configured to:
        receive the control signal at a gate terminal thereof and the first voltage level at a source terminal thereof; and
        generate the second voltage level at a drain terminal thereof; and
    a capacitor connected between the gate and drain terminals of the PMOS transistor.

10. The apparatus of claim 9, wherein the capacitor is an N-channel Metal-Oxide Semiconductor (NMOS) transistor.

11. A system, comprising:
    a first circuit coupled to a first power supply;
    a second circuit coupled to a second power supply and the first circuit unit, wherein a voltage level of the second power supply is greater than a voltage level of the first power supply; and
    a level shifter unit configured to:
        receive an input signal from the first circuit, wherein the input signal transitions between a ground potential and the voltage level of the first power supply;
        generate at least one intermediate signal dependent upon the input signal, wherein the at least one intermediate signal transitions between the ground potential and an intermediate voltage level;
        generate a control signal dependent upon the at least one intermediate signal and the at least one output signal;
        change a value of the intermediate voltage level from a third value to a fourth value dependent upon the control signal, wherein the fourth value is greater than the third value, and the voltage level of the second power supply is greater than the fourth value, and wherein the first third value is substantially the same as the voltage level of the first power supply; and generate at least one output signal dependent upon the at least one intermediate signal, wherein the output signal transitions between the ground potential and the voltage level of the second power supply.

12. The system of claim 11, wherein the level shifter unit is configured to generate the control signal only when the at least one output signal fails to transition in response to and dependent upon a corresponding transitioning of the input signal.

13. The system of claim 11, wherein the at least one intermediate signal includes:

a ground potential state of the input signal; and the intermediate voltage level of the input signal;

and wherein the at least one output signal includes:

a ground potential state of the output signal; and the voltage level of the second power supply.

14. A method, comprising:

receiving an input signal, wherein the input signal transitions between a ground potential and a first voltage level;

generating at least one buffered signal dependent upon the input signal, wherein the at least one buffered signal transitions between the ground potential and an intermediate voltage level;

generating a control signal based dependent upon the at least one buffered signal and the at least one output signal;

changing a value of the intermediate voltage level from a third value to a fourth value dependent upon the control signal, wherein the fourth value is greater than the third value, and wherein the third value is substantially the same as the first voltage level; and generating at least one output signal dependent upon the at least one buffered signal, wherein the at least one output signal transitions between the ground potential and a second voltage level, and wherein the second voltage level is greater than the second value of the intermediate voltage level.

15. The method of claim 14, wherein generating the control signal includes generating the control signal based on an exclusive-OR (XOR) operation between the at least one buffered signal and the at least one output signal.

16. The method of claim 14, wherein changing the value of the intermediate voltage level includes changing the value of the intermediate voltage level from the third value to the fourth value in response to the control signal being asserted.

* * * * *